(12) United States Patent
Ng et al.

(10) Patent No.: US 9,374,934 B2
(45) Date of Patent: Jun. 21, 2016

(54) CARRIER TAPE

(71) Applicant: 3M INNOVATIVE PROPERTIES COMPANY, St. Paul, MN (US)

(72) Inventors: Chee Ming Ng, Singapore (SG); Shiow Shya Ling, Singapore (SG); Wai Thoo Leong, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/747,080

(22) Filed: Jun. 23, 2015

(65) Prior Publication Data

US 2015/0289427 A1    Oct. 8, 2015

Related U.S. Application Data

(62) Division of application No. 14/350,581, filed as application No. PCT/US2012/067757 on Dec. 4, 2012, now Pat. No. 9,090,403.

(60) Provisional application No. 61/576,635, filed on Dec. 16, 2011.

(51) Int. Cl.
*B65G 15/30* (2006.01)
*H05K 13/00* (2006.01)

(52) U.S. Cl.
CPC .......... *H05K 13/0084* (2013.01); *B65G 15/30* (2013.01)

(58) Field of Classification Search
CPC ............. B65D 1/00; H05K 13/0084; H01L 2221/68313; H01L 21/67356
USPC ............ 198/803.14, 803.15, 867.11, 867.12; 206/713, 714; 428/35.7
See application file for complete search history.

(56) References Cited

U.S. PATENT DOCUMENTS

| | | | |
|---|---|---|---|
| 4,708,245 A | 11/1987 | Boeckmann et al. | |
| 4,736,841 A | 4/1988 | Kaneko et al. | |
| 6,142,306 A * | 11/2000 | Mori ............... | H05K 13/003 206/460 |
| 9,090,403 B2 * | 7/2015 | Ng .................. | H05K 13/0084 |
| 2007/0074996 A1 | 4/2007 | Nice et al. | |
| 2009/0145543 A1 | 6/2009 | Velasquez Urey et al. | |

FOREIGN PATENT DOCUMENTS

WO   WO 2013/029261   3/2013

OTHER PUBLICATIONS

PCT International Search Report for PCT/US2012/067757 mailed on Jun. 10, 2013, 3 pages.

* cited by examiner

*Primary Examiner* — James R Bidwell
(74) *Attorney, Agent, or Firm* — Adam Bramwell

(57) ABSTRACT

The present invention is directed to a carrier tape having pockets for carrying electronic components. The carrier tape includes a longitudinally extending elevated central portion having a plurality of pockets formed therein and two side portions, each side portion disposed on opposite sides of the elevated central portion and extending longitudinally therewith, wherein each side portion is attached to the elevated central portion by an inclined portion such that the central portion is higher than the side portions when disposed in a flat configuration.

7 Claims, 10 Drawing Sheets

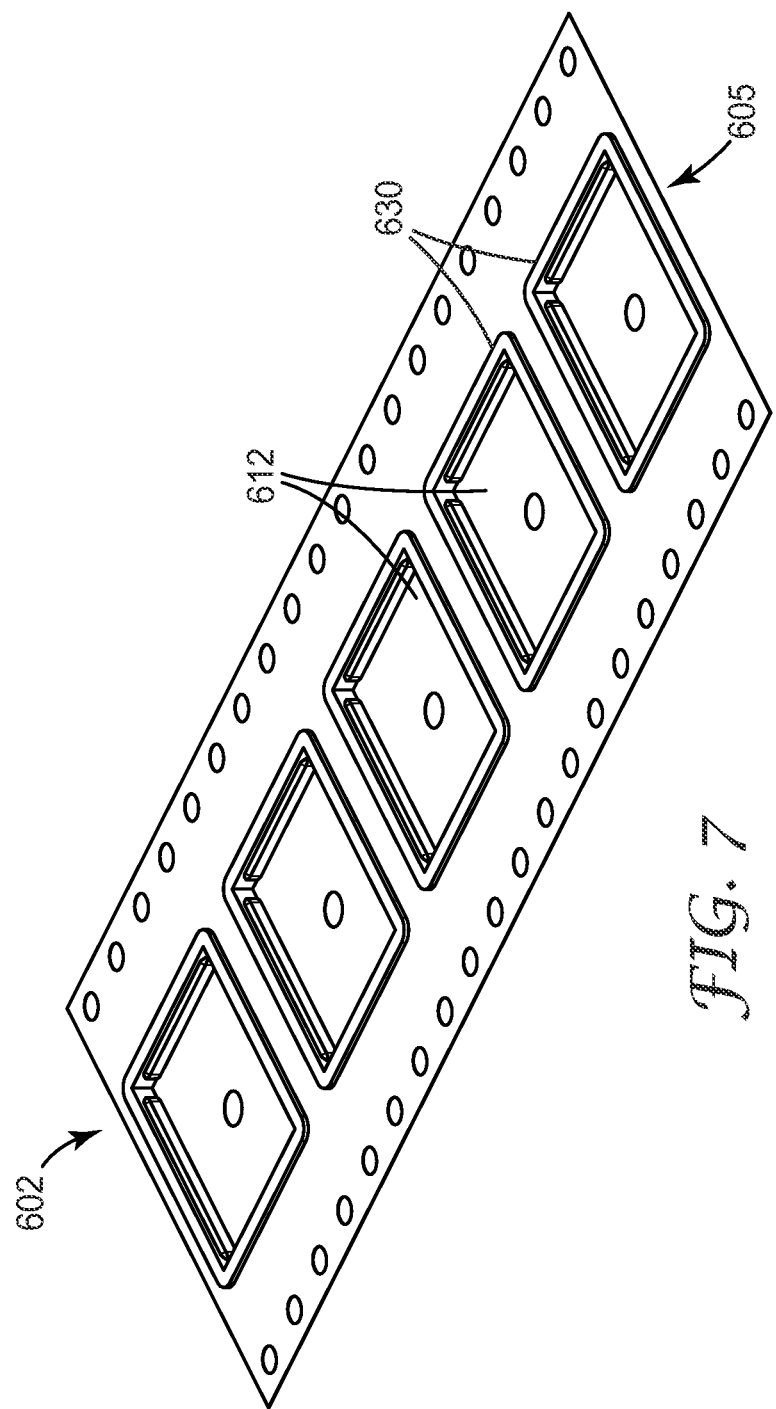

CARRIER TAPE

CROSS REFERENCE TO RELATED APPLICATIONS

This application is a divisional of U.S. application Ser. No. 14/350,581, filed Apr. 9, 2014, now allowed, which is a national stage filing under 35 U.S.C. 371 of PCT/US2012/067757, filed Dec. 20, 2012, which claims priority to U.S. Provisional Application No. 61/576,635, filed Dec. 16, 2011, the disclosure of which is incorporated by reference in its/their entirety herein.

The present invention relates to a carrier tape for electronic component packaging applications. In particular, the carrier tape includes an elevated central portion adjacent to two lower side portions to minimize migration of the electronic component out of the pockets disposed in the elevated central portion of the carrier tape.

BACKGROUND

As electronic equipment is miniaturized, the storage, handling, and transport of electronic components become more important. Generally, the electronic components are transported to an assembly location in a carrier tape assembly that has a plurality of pockets formed therein to hold the electronic components. The carrier tape assembly includes a carrier tape and a cover tape or film. Carrier tapes are often manufactured in a thermoforming or embossing operation in which a web of thermoplastic polymer is delivered to a mold that forms the component pockets in the carrier tape. A cover film can be heat sealed continuously along the edges of the carrier tape to seal the electronic components within the pockets of the carrier tape.

The electronic components are mounted onto a printed circuit board (PCB) or other substrate during assembly of electronic equipment or sub-assemblies that will be used later to build electronic equipment. The cover film is removed from the carrier tape during this assembly process to expose the electronic components residing within the pockets of the carrier tape. The component is typically lifted from a pocket by automatic precision placement machines and mounted to the PCB or substrate being assembled.

However, as semiconductor or other electronic components become smaller and thinner, the electronic components can migrate out of the pocket during shipping and handling. FIGS. 1A and 1B show how electronic devices can migrate out of the pocket of two styles of conventional carrier tapes.

FIG. 1A shows a conventional carrier tape assembly 100 including a carrier tape 102. Carrier tape 102 includes central portion 105 extending longitudinally along the length of the carrier tape and two side portions 104, 106, each side portion disposed on opposite sides of the central portion and extending longitudinally therewith. The central portion has a plurality of pockets 112 formed therein. The side portions are disposed on opposite sides of the central portion and extend longitudinally therewith. In addition, each of the side portions includes a row of aligned advancement structures 108 and 110 such that the advancement structures extend along the edges of the carrier tape. The side portions and central portion are flat and lie in the same plane.

Carrier tape 102 may be formed of any polymeric material that has a sufficient thickness and flexibility to permit it to be wound about the hub of a storage reel. A variety of polymeric materials may be used including, but not limited to, polyester (e.g., glycol-modified polyethylene terephthalate), polycarbonate, polypropylene, polystyrene, polyvinyl chloride, and acrylonitrile-butadiene-styrene.

Carrier tape assembly 100 typically further includes an elongate cover film 120 applied over the pockets of carrier tape 102 to retain electronic components therein. As illustrated, cover film 120 includes parallel longitudinal bonding portions 122, 124 that are bonded to top surface of side portions 104,106, respectively, of the carrier tape. For example, a pressure sensitive adhesive such as an acrylate material, or a heat-activated adhesive such as an ethylene vinyl acetate copolymer, can be used to adhere the cover film to top surface of side portions 104, 106.

Because the bonding portions 122, 124 are spaced away from the edges 113, 114 of the pockets 112 formed in the central portion of carrier tape 102, the electronic devices, such as electronic device 130, can migrate out of the pocket during shipping and handling. When this occurs, the electronic devices can pop off of the carrier tape when the cover film is removed and be lost.

FIG. 1B shows an alternative conventional carrier tape assembly 200 has a strip portion 202. Strip portion 102 includes central portion 205 having a plurality of pockets 212 formed therein and an elevated land portion 209 between adjacent pockets along the length of the central portion of the carrier tape, two side portions 204, 206, the side portions are disposed on opposite sides of the central portion and extending longitudinally therewith, and a row of aligned advancement structures 210 formed in side portion 206.

Carrier tape 100 typically further includes an elongate cover film 220 applied over the pockets of the strip portion to retain electronic components therein. As illustrated, cover film 220 includes parallel longitudinal bonding portions 222, 224 that are bonded to longitudinal top surfaces of edge portions 104,106 of strip portion 102.

Because the bonding portions 222, 224 are spaced away from the edges 213, 214 of the pockets 212, the electronic devices such as electronic device 230, can migrate out of the pocket during shipping and handling When this occurs, the electronic devices can pop off of the carrier tape when the cover film is removed and be lost.

SUMMARY

The present invention is directed to a carrier tape having pockets for carrying electronic components. The carrier tape includes a longitudinally extending elevated central portion having a plurality of pockets formed therein and two side portions, each side portion disposed on opposite sides of the elevated central portion and extending longitudinally therewith, wherein each side portion is attached to the elevated central portion by an inclined portion such that the central portion is higher than the side portions when disposed in a flat configuration.

The pocket includes at least one side wall that extends down from a top surface of the elevated central portion and connects to a bottom wall. The bottom wall of the pocket defines a reference plane for the carrier tape. In one exemplary aspect, the side portions of the carrier tape are disposed at a first reference height relative to the reference plane and the central portion of the carrier tape is disposed at a second reference height relative to the reference plane and wherein the second reference height is greater than the first reference height.

In an alternative embodiment, carrier tape having pockets for carrying electronic components can include a longitudinally extending central portion having a plurality of pockets formed therein and a plurality of elevated lip portions at least partially surrounding the pockets. The elevated lip portions are disposed adjacent to at least a portion of each edge of each pocket formed within the central portion. The carrier tape can further include two side portions wherein each side portion disposed on opposite sides of the central portion and extends longitudinally therewith. Each of the side portions includes an adhesion zone that is spaced apart from the edge of the pockets and is adapted to adhere to a cover tape to the carrier tape. In one exemplary aspect, the elevated lip portions are discontinuous while in another exemplary aspect the elevated lip portions are continuous and completely surround the edges of the pockets.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The present invention will be further described with reference to the accompanying drawings, wherein:

FIG. 7 is an isometric view of a fourth embodiment of a carrier tape according to an aspect of the invention.

Figure 1A:
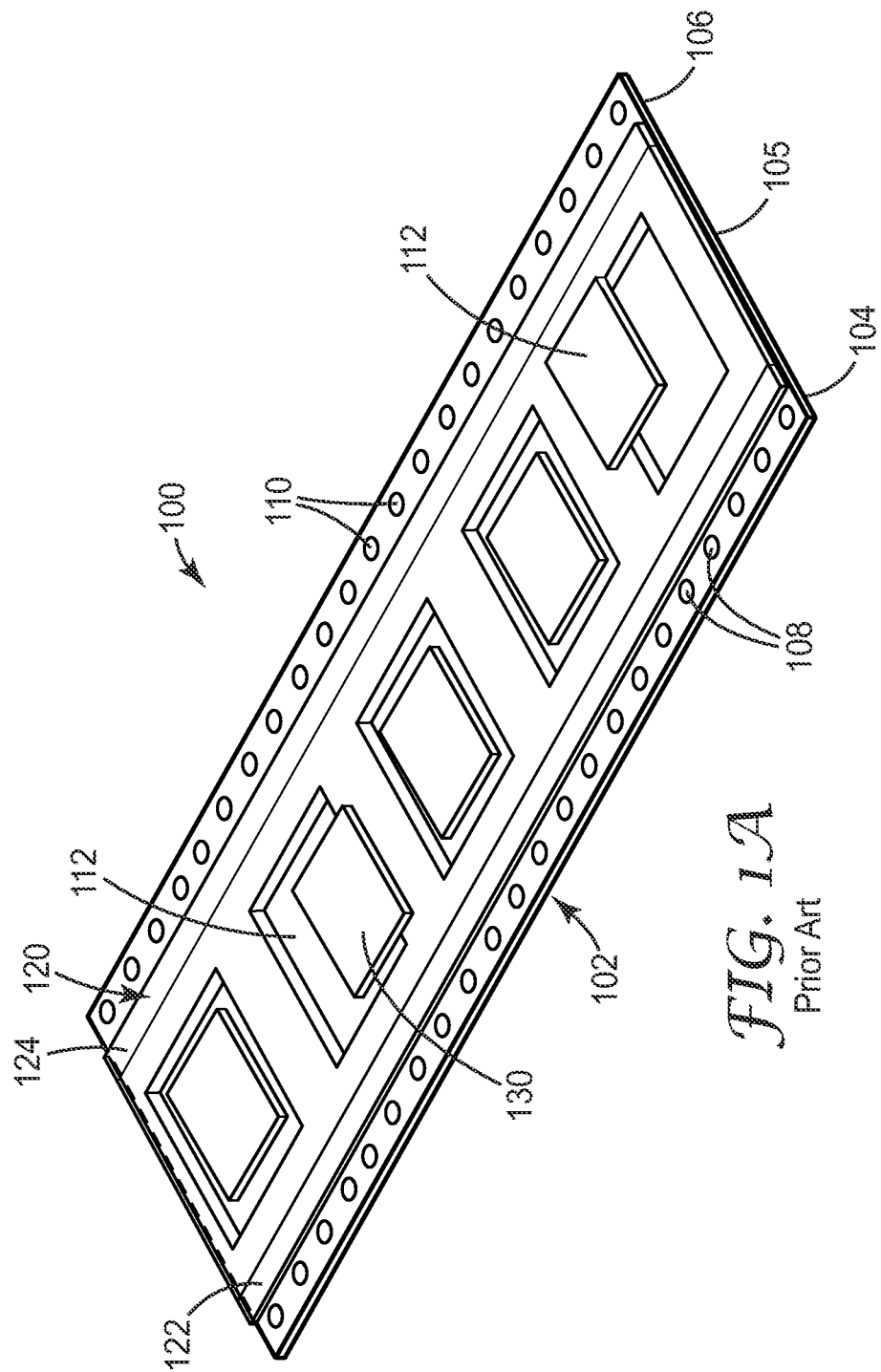
FIG. 1A and 1B are isometric views of conventional carrier tape assemblies.
Figure 1B:
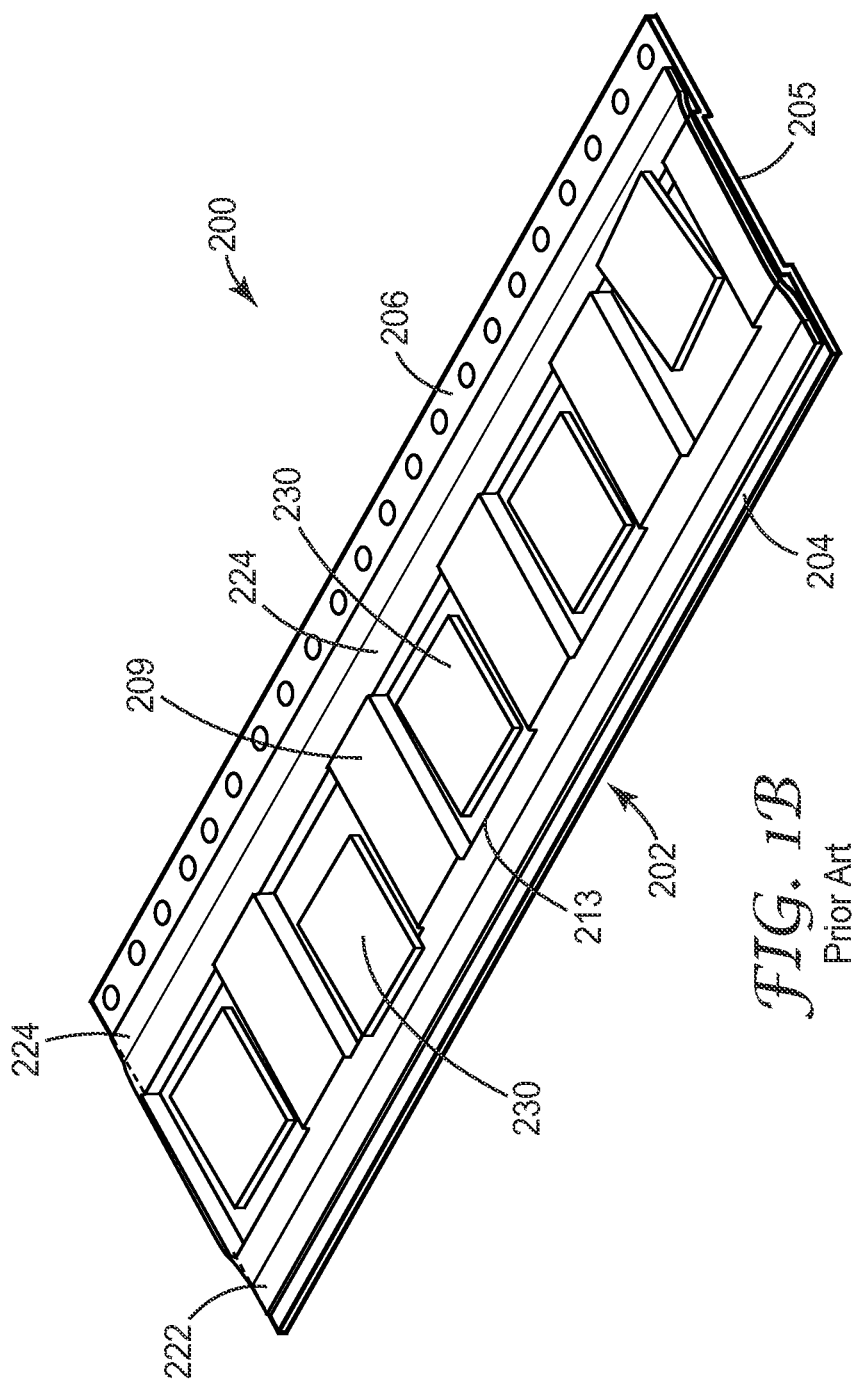

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the FIG(S). being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In an exemplary aspect, a carrier tape assembly includes a carrier tape and a cover film bonded to a side portion of the carrier tape. The carrier tape assembly is used to transport and store electronic component used in PCB assembly for electronic devices. The electronic component can be disposed in pockets formed in the carrier tape. Specifically referring to FIGS. 2 and 3A-3B, carrier tape assembly 300 includes a carrier tape 302 and a cover film 320.

Carrier tape 302 includes a longitudinally extending elevated central portion 305 having a plurality of pockets 312 formed therein and two side portions 304, 306. The side portions are disposed on opposite sides of the central portion and extend longitudinally therewith and define the longitudinal axis of the carrier tape. Each side portion 304, 306 is attached to the elevated central portion 305 by an inclined portion 307, 309 such that the central portion is higher than the side portions when disposed in a flat configuration.

In an exemplary aspect, the elevated central portion 305 can include a plurality of plateau portions 315 disposed between adjacent pockets 312 and a pair of rail portions 316 that extend longitudinally along the elevated central portion on either side of the pockets. In an alternative aspect having a plurality of pockets formed in the elevated central portion transverse to the longitudinal axis of the carrier tape, the carrier tape can have one or more additional rail portions between adjacent pockets.

Figure 3A:
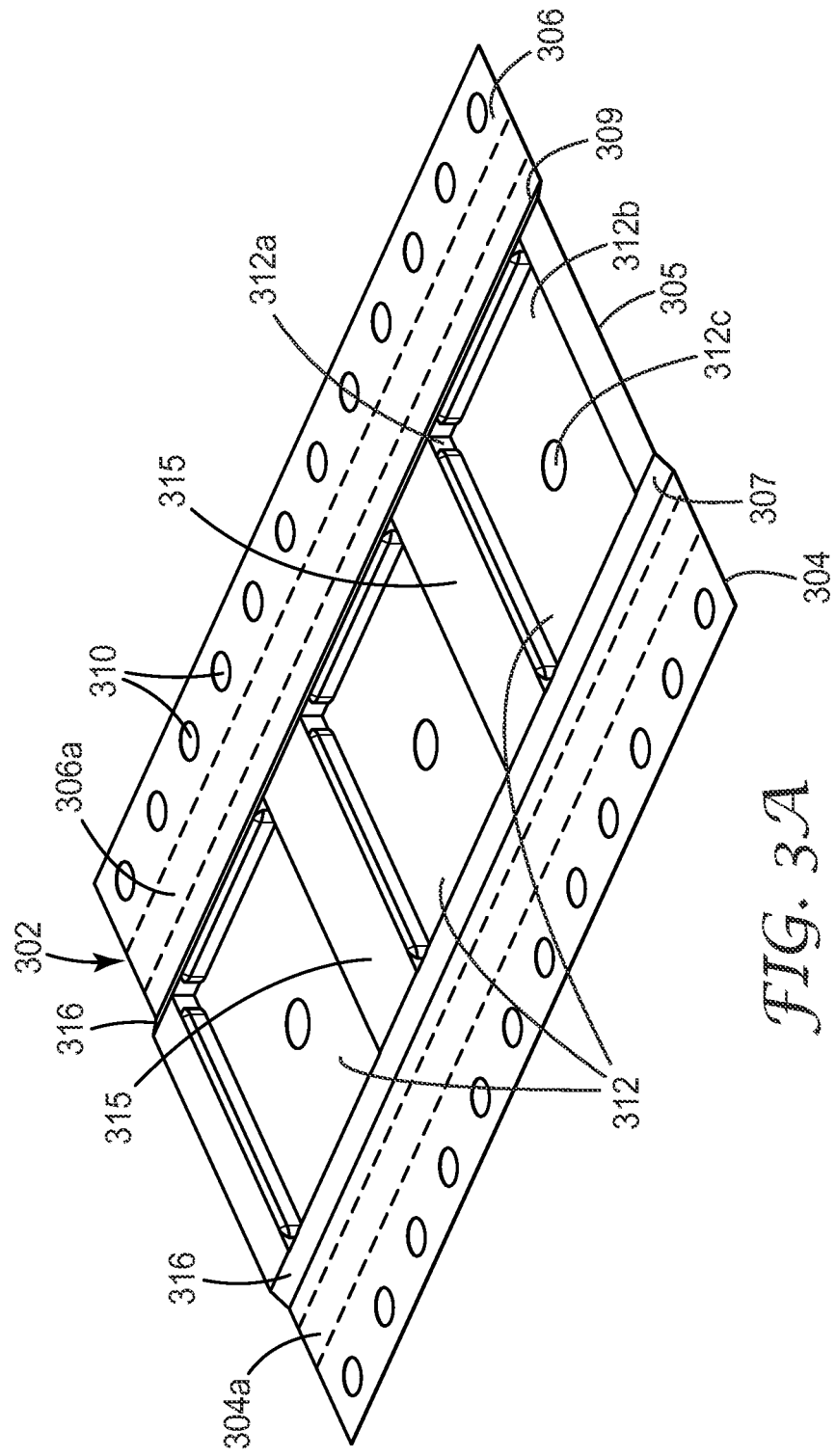
FIG. 3A is an isometric view of an exemplary carrier tape of the carrier tape assembly of FIG. 2.
Figure 3B:
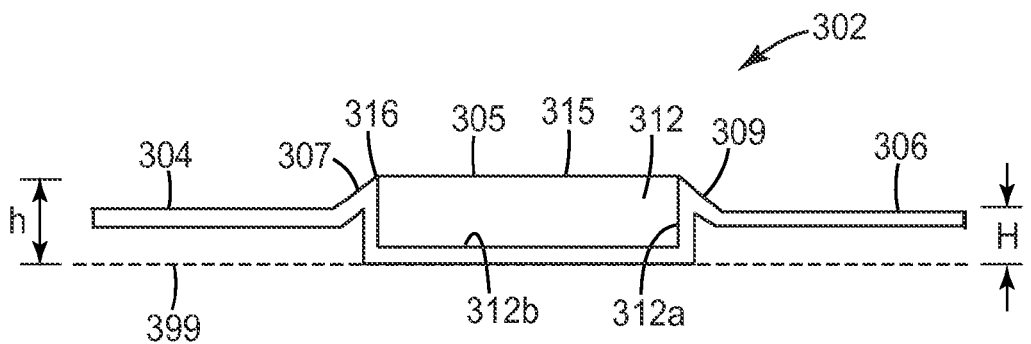
FIG. 3B is a cross sectional view of the carrier tape of FIG. 3A.
Figure 5A:
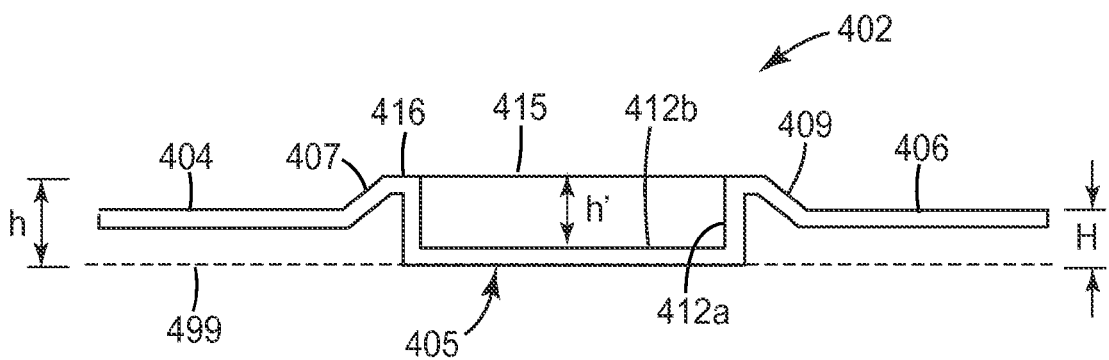
FIGS. 5A and 5B show two views of an alternative carrier tape according to an aspect of the invention.

The width of the rail portions 316 dictates the distance between the top of the inclined portion 307, 309 and the transverse edges of pocket 312. The rail portions are characterized by a rail surface. The rails shown in the exemplary embodiment shown in FIG. 3A and 3B have a fairly narrow rail surface having a distinct ridge line. In an exemplary aspect, the minimum width of the rail portions 316 is about 0.60 mm, but can be greater depending on the design of the carrier tape used. The rail portions 316 of carrier tape 302 of the exemplary embodiment shown in FIG. 3A and 3B are fairly narrow having a distinct ridge line wherein the ridge line is parallel to reference plane 399. Alternatively, rail portions 416 of carrier tape 402 shown in FIGS. 5A are wider and have flat top rail surfaces which are parallel to reference plane 499.

Meanwhile the width of the plateau portion dictates the distance between pockets along the longitudinal axis of the carrier tape and is characterized by a plateau surface. In an exemplary aspect, the minimum width of the plateau portions is about 0.60 mm, but can be greater depending on the pocket pitch of the carrier tape design used.

In the exemplary embodiment seen in FIGS. 3A-B and 4A-C the plateau surfaces and the rail surfaces are coplanar (i.e. they are at the same reference height. In alternative embodiments seen in FIGS. 5A-B, the plateau surfaces are higher than the rail surfaces.

In the embodiment shown in FIGS. 3A-3B, each pocket 312 includes four side walls 312a, each formed generally at a right angle with respect to each adjacent wall. Side walls 312a adjoin and extend downwardly from the top surface of the central portion of the carrier tape and adjoin bottom wall 312b to form the pocket. Bottom wall 312b is generally planar and defines a reference plane 399. The bottom wall and hence the reference plane are parallel to the surface of the side portions 304, 306 and defines a first reference height, H. In an exemplary aspect, the first reference height, H, (i.e. the distance between the plane formed by the top surface of the side portions and the reference plane) can be from about 1.50 mm to about 5.00 mm, but may vary depending on the thickness of the electronic component to be placed in the pocket of the carrier tape. Similarly, the bottom wall and hence the reference plane 399 are parallel to at least a portion of the surface of the elevated central portion 305 and defines a second reference height, h. In an exemplary aspect, the second reference height, h, (i.e. the distance between the plane formed by the top surface of the elevated central portion and the reference plane) can be from about 1.00 mm to about 4.50 mm, but again may vary depending on the thickness of the electronic component to be placed in the pocket of the carrier tape. The second reference height can be the effective depth of the pocket less the thickness of the bottom wall of pocket 312 and can be dictated in part by the thickness of the electronic component to be placed within the pocket. In one exemplary aspect, the second reference height is greater than the first reference height.

In an exemplary aspect, the rail portions 316 and the plateau portions 315 of the elevated central portion can be disposed at the same height relative to the reference plane 399 as shown in FIG. 3B, (i.e. the rail portions and the plateau portions can be disposed at the second reference height, h, above the reference plane.

Figure 5B:
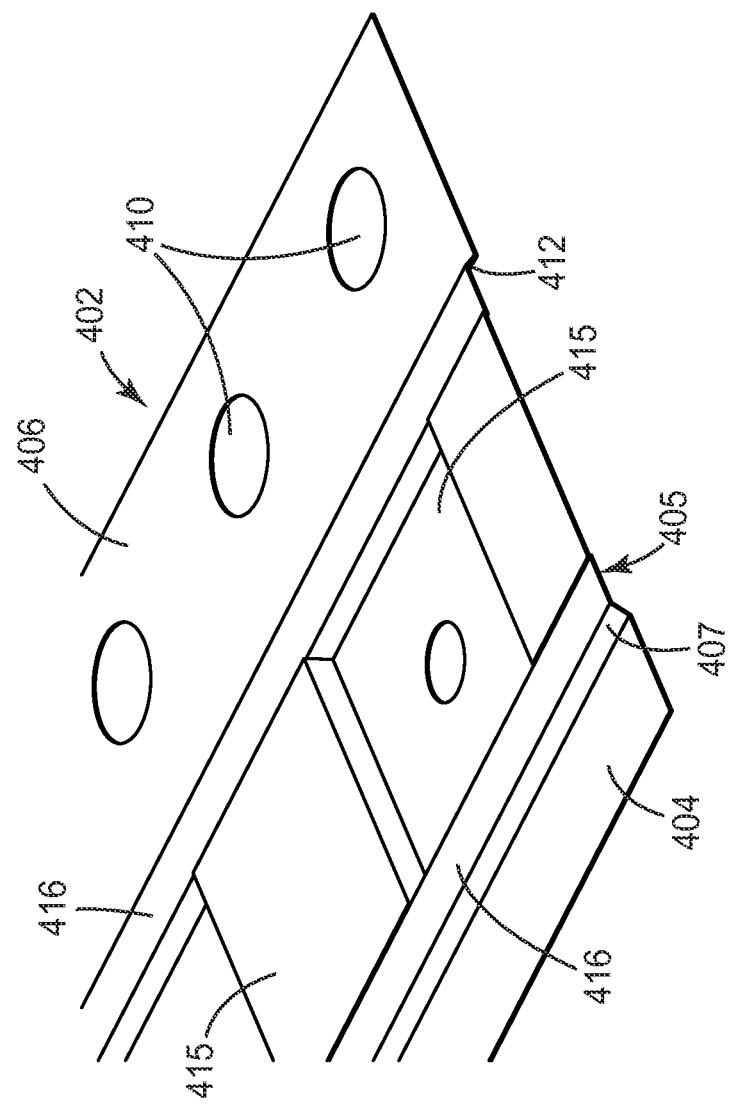

In an alternative aspect, the rail portions and the plateau portions can be disposed at different reference heights relative to the reference plane. For example, FIGS. 5a and 5B show an alternative embodiment of an exemplary carrier tape of the current invention. In particular, carrier tape 402 includes a longitudinally extending elevated central portion 405 having a plurality of pockets 412 formed therein and two side portions 404, 406. The side portions are disposed on opposite sides of the central portion and extend longitudinally therewith and defining the longitudinal axis of the carrier tape. Each side portion 404, 406 is attached to the elevated central portion 305 by an inclined portion 407, 409 such that the central portion is higher than the side portions when disposed in a flat configuration. The elevated central portion 405 can include a plurality of plateau portions 415 disposed between adjacent pockets 412 and a pair of rail portions 416 that extend longitudinally along the elevated central portion on either side of the pockets. Specifically, the rail portions 416 of carrier tape 402 can be disposed at a second reference height, h, and the plateau portions 415 of elevated central portion 405 can be at a third reference height h' as shown in FIG. 5A.

In general, pockets 312 are designed to accommodate the size and shape of the electronic components that they are intended to receive. Although not specifically illustrated, the pockets may have more or less side walls than the four that are shown in the preferred embodiment. In general, each pocket includes at least one side wall that adjoins and extends downwardly from the elevated central portion 305 of the carrier tape, and a bottom wall that adjoins the side wall to form the pocket. Thus, the pockets may be circular, oval, triangular, pentagonal, or have other shapes in outline. Each side wall may also be formed with a slight draft (i.e., a 2° to 12° slant toward or away from the center of the pocket) in order to facilitate insertion of the component, and to assist in releasing the pocket from a mold or forming die during fabrication of the carrier tape. The depth of the pocket can also vary depending on the component that the pocket is intended to receive. In addition, the interior of the pocket may be formed with ledges, ribs, pedestals, bars, tabs, and other similar structural features to better accommodate or support a particular type of electronic components. Although a single row of pockets is illustrated in the drawings, two or more rows of aligned pockets could also be formed along the length of the elevated central portion in order to facilitate the simultaneous delivery of multiple electronic components.

As shown in FIG. 3A, bottom wall 312b can include a vacuum hole 312c which is used in applying a vacuum to the pocket to permit more efficient loading of the pockets with the electronic components. In addition, the vacuum hole can also be used for visual inspection to confirm that the electronic of component is present in the pocket.

Each side portion 304, 306 includes an adhesion zone 304a, 306a that is spaced apart from the elevated central portion of the carrier tape. The adhesion zones define the attachment region for cover film 320, as shown in FIG. 4B, to form the carrier tape assembly. The cover film can be continuously adhered to the carrier tape within the adhesion zone along the longitudinal length of the carrier tape. In an exemplary aspect, the width of the bond area between the cover film and the carrier tape on both side portions are of the same width. Having two continuous bond areas allows for a stable and even separation of the cover film from the carrier tape during electronic equipment assembly operations. In addition, having the adhesion zones spaced apart from the elevated central portion and the pockets formed therein helps to minimize contamination of the electronic devices house within the pockets when the cover film is removed from the carrier tape.

Figure 2:
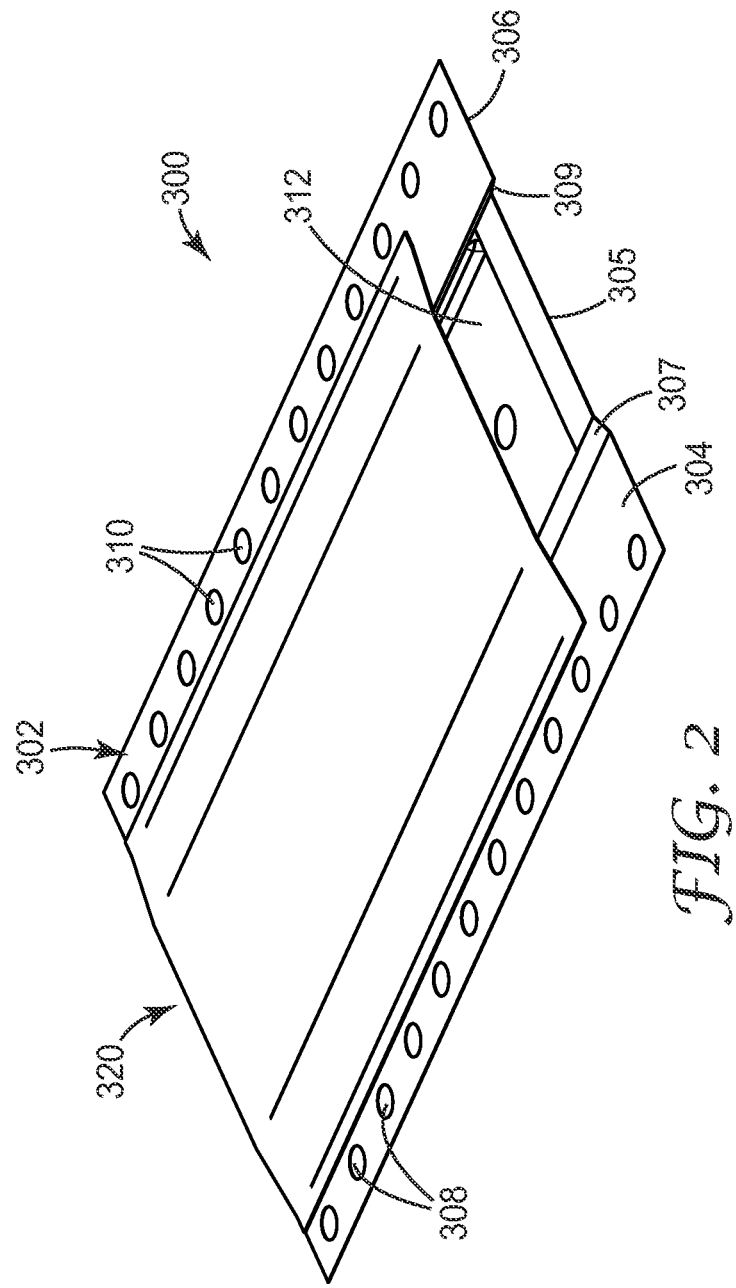
FIG. 2 is an isometric view of a carrier tape assembly utilizing a carrier tape according to an aspect of the invention.

Each side portion 304, 306 can further include a row of aligned advancement structures 308, 310 such that the advancement structures both edges of the carrier tape 302 as shown in FIGS. 2 and 3A. In an alternative aspect, the carrier tap can have a single row of advancement structures formed on only one of the side portions of the carrier tape. The advancement structures can engage with teeth on a sprocketed drive (not shown) as may be present in the drive assemblies of the precision placement equipment used to remove the electronic components from the pockets of the carrier tape. The advancement structures are used to advance the carrier tape to a prescribed location such that the electronic component can be placed in or removed from the pocket of the carrier tape.

Carrier tape 302 may be formed of any resin material that has a sufficient gauge and flexibility to permit it to be wound about the hub of a storage reel. In addition, the resins that can be used for component carrier tapes of this invention are dimensionally stable, durable, and readily formable into the desired configuration. Suitable resin materials include, but are not limited to, polyesters (e.g., glycol-modified polyethylene terephthalate, or polybutylene terephthalate), polycarbonate, polypropylene, polystyrene, polyvinyl chloride, acrylonitrile-butadiene-styrene, amorphous polyethylene terephthalate, polyamide, polyolefins (e.g. polyethylene, polybutene, or polyisobutene), modified poly(phenylene ether), polyurethane, polydimethylsiloxane, acrylonitrile-butadiene-styrene resins, and polyolefin copolymers. In some embodiments, the material has a melt temperature in the range of 400° F. to 630° F. The carrier tape may be optically clear, pigmented or modified to be electrically dissipative. In the latter case, the carrier tape may include an electrically conductive material, such as carbon black or vanadium pentoxide, either dispersed within the resin material or coated onto the surface(s) of the formed carrier tape. The electrically conductive material helps dissipate an electric discharges that can occur during removal of the cover film or unwinding of the carrier tape assembly from a storage spool thus helping to prevent damage to the electronic components contained within the pockets of the carrier tape. In addition dyes, colorants, pigments, UV stabilizers, or other additives may be added to the resin material before forming the carrier tape.

As previously mentioned carrier tape assembly 300 further includes cover film 320 applied over the pockets 312 of carrier tape 302 to retain the electronic components therein. As illustrated in FIG. 2 and FIGS. 4A-4C, cover film 320 includes parallel longitudinal bonding portions 322, 324 that are bonded to the top surface of side portions 304, 306 in adhesion zones 304a, 306a, respectively, of the carrier tape at a position that is spaced away from the edges of the pockets disposed in the central portion of the carrier tape. The cover film can include an adhesive layer such as a pressure sensitive adhesive such as an acrylate based adhesive strip coated onto a backing layer, or a heat-activated adhesive such as an ethylene vinyl acetate copolymer coated on a support layer. The adhesive layer can be used to adhere the cover film to top surface of side portions 304, 306 of carrier tape 302. In one exemplary aspect, the cover film can be a heat sealable cover film as described in International Patent Application No. PCT/CN2011/079229, which is herein incorporated by reference in its entirety. In an alternative exemplary aspect, the cover film can have a pair of adhesive strips disposed along the longitudinal edges of the cover film as described in US Patent Publication No. 2009/0145543, which is herein incorporated by reference in its entirety.

Figure 4C:
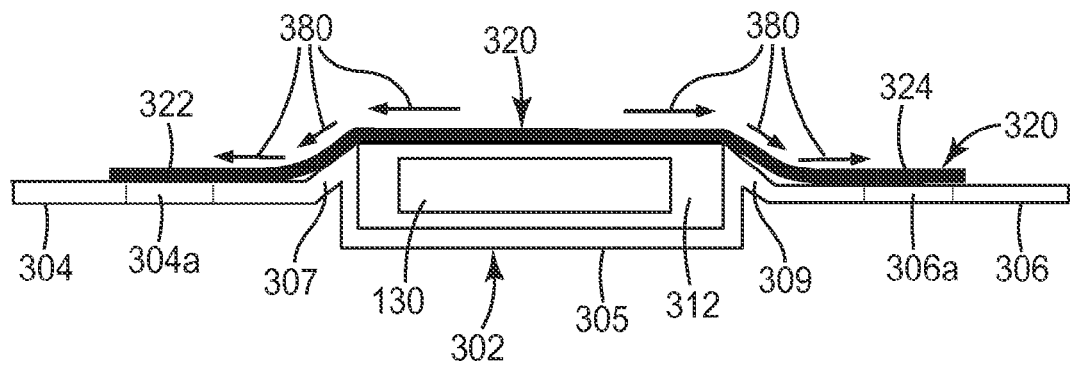
FIG. 4A-4C shows the formation of the carrier tape assembly of FIG. 2.
Figure 4A:
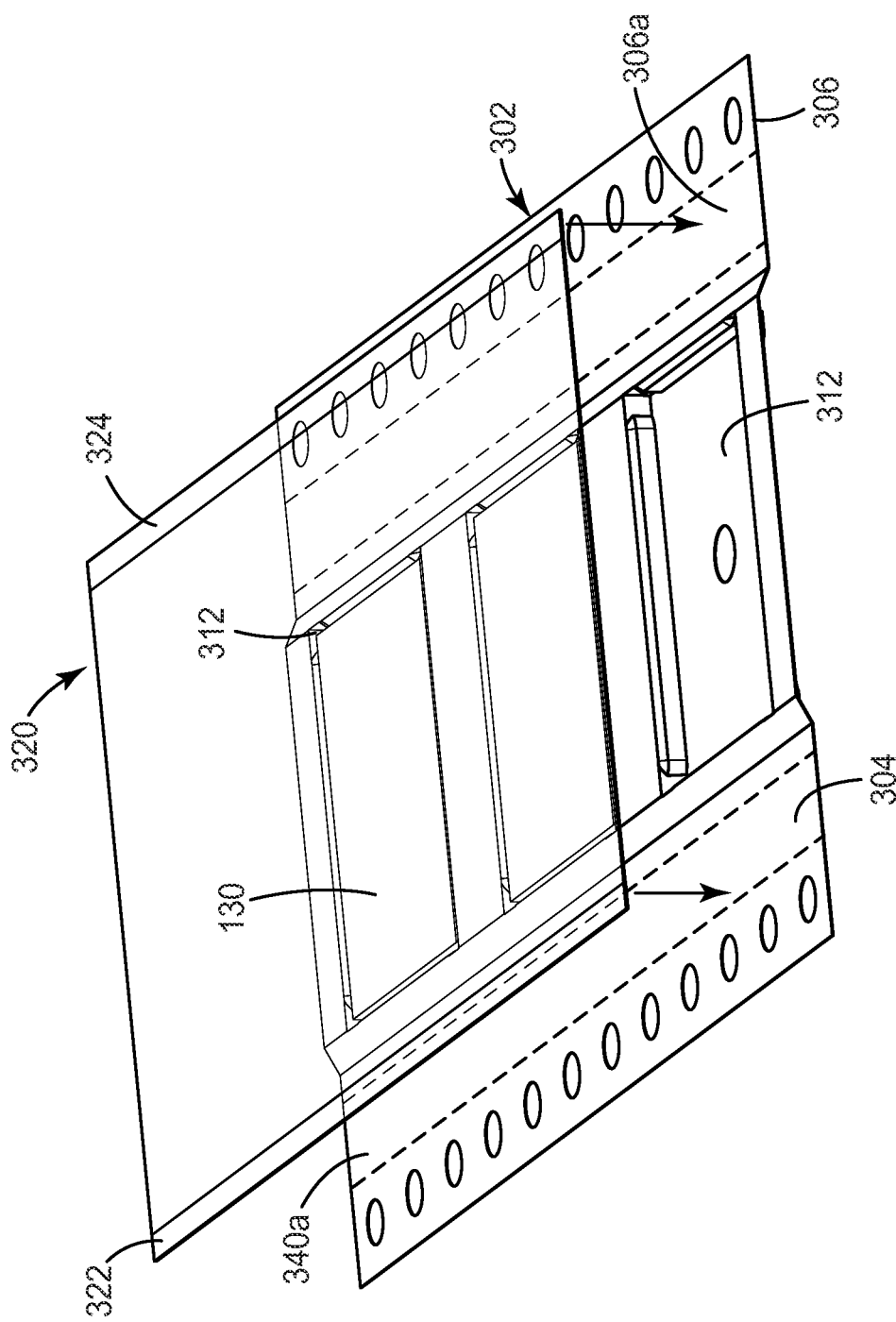
Figure 4B:
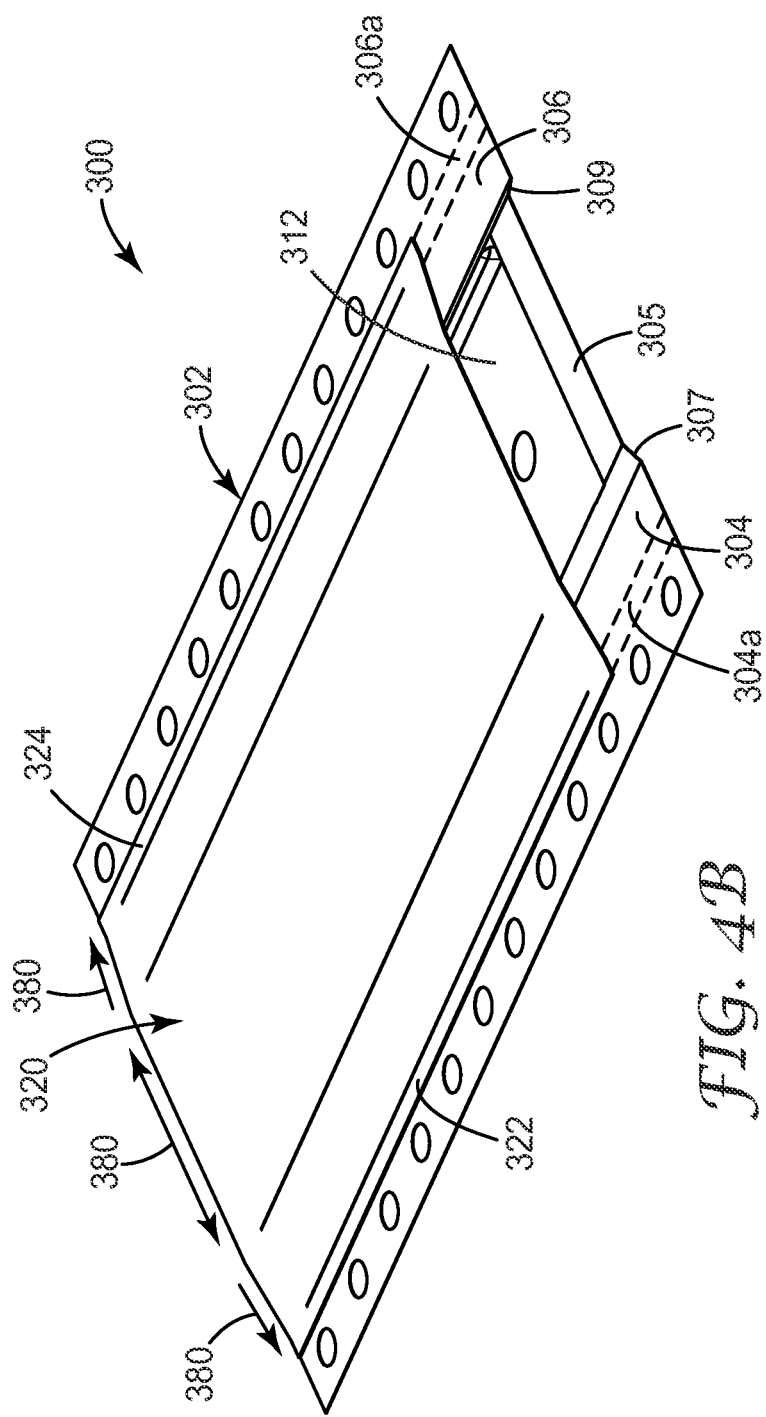

One of the advantages of having a raised central portion or raised lips portions (described in detail below with respect to FIGS. 6 and 7) surrounding at least a portion of each edge of the pockets in combination with having the adhesion zone spaced away from the edges of the pockets, is that tension is applied to the film as it is formed over and down the raised portions and anchored to the lower side portions of the carrier tape as shown by arrows 380 in FIGS. 4B and 4C. In an exemplary aspect, the cover film can be extendible such that it can be stretched over and down the raised portions and anchored to the lower side portions of the carrier tape. The tentering of the film over the elevated features helps prevent the electronic devices 130 for migrating out of the pocket as the downward tension on the cover film as it passes over the elevated features prevents the entrapment of a corner of the electronic device between the carrier tape and the cover film in a carrier tape assembly during transport and or storage.

Figure 6:
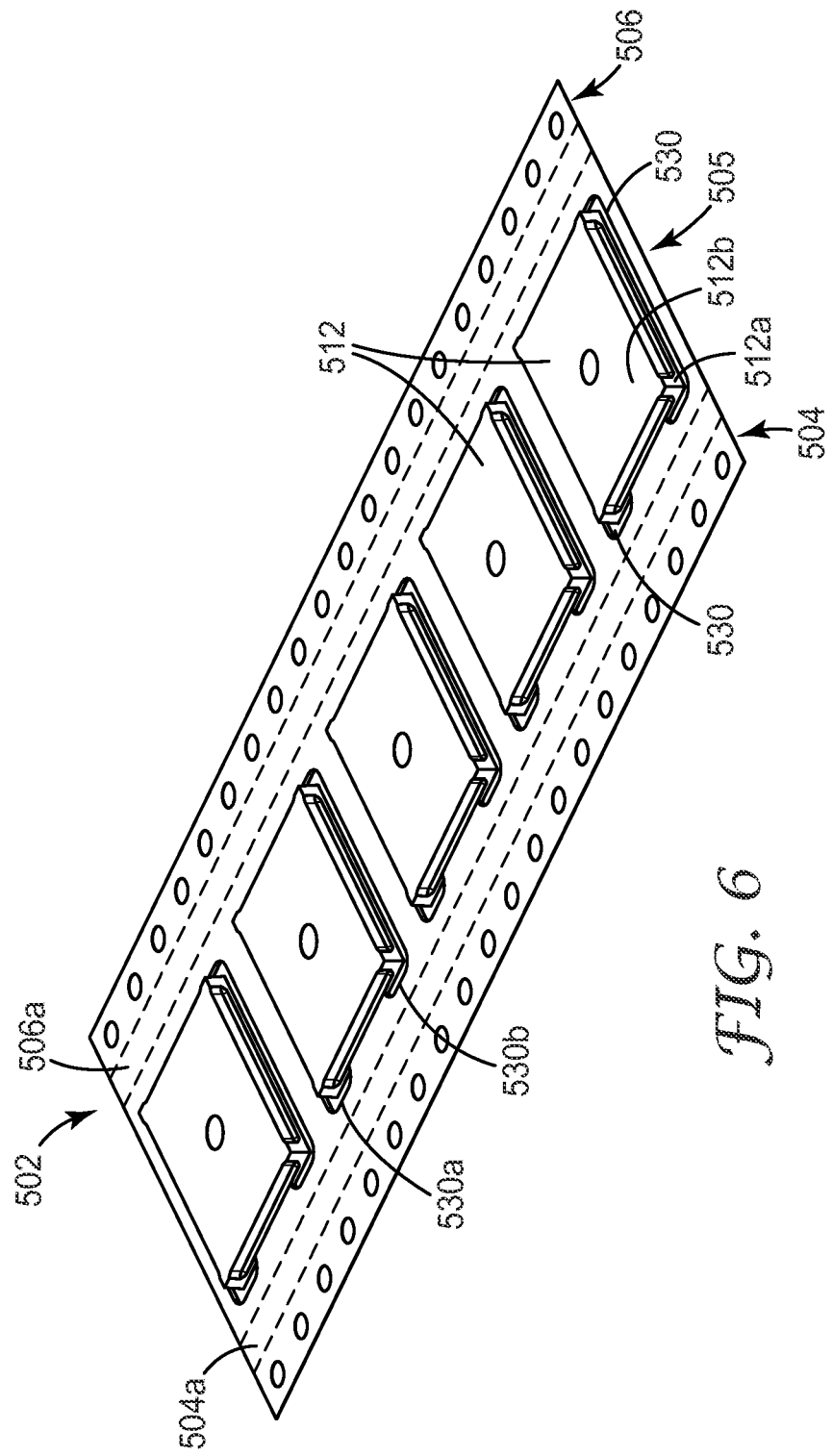
FIG. 6 is an isometric view of a third embodiment of a carrier tape according to an aspect of the invention.

FIG. 6 shows a third embodiment of a carrier tape 502 utilizing a carrier tape according to an aspect of the invention. Carrier tape 502 has a longitudinally extending central portion 505 having a plurality of pockets 512 formed therein and a plurality of elevated lip portions 530 wherein the elevated lip portions are adjacent to at least a portion of each edge of each pocket formed within the central portion. In the exemplary aspect shown in FIG. 6, the pocket is bordered by a pair of discontinuous bracket shaped lip portions. When the pockets have a rectangular shape, the pair of discontinuous shaped lip portions can be square brackets ([ ]), such that the open sides of the square bracket face each other, thus enclosing at least a portion of each edge of pocket 312.

Carrier tape 502 further includes two side portions 504, 506, each side portion disposed on opposite sides of central portion 505 and extending longitudinally therewith. Each side portion 504, 506 includes an adhesion zone 524, 526, respectively, that is spaced apart from the elevated lip potions that extend around pocket parallel to the longitudinal direction of the carrier tape. The adhesion zones being adapted to adhere to a cover tape at a distance spaced apart from the edge of the pocket.

In an exemplary aspect, the side of the elevated lip portion 530 facing the pockets can be an extension of the side walls 512a of the pocket, such that side walls 512a adjoin and extend downwardly from the top of the elevated lip portion of the carrier tape and adjoin bottom wall 512b to form the pocket. Bottom wall 512b is generally planar and defines a reference plane. The bottom wall and hence the reference plane are parallel to the surface of the side portions 504, 506 and defines a first reference height, H. Similarly, the bottom wall and hence the reference plane are parallel to at least a portion of the top surface of the elevated lip portion 530 and defines a second reference height, h, wherein the second reference height is greater than the first reference height.

FIG. 7 shows a fourth embodiment of a carrier tape 602 which is similar to carrier tape 502 except that elevated lip portion 630 is continuous and completely surrounds pocket 612 disposed in the central portion 605 of carrier tape 602.

Item 1 is a carrier tape having pockets for carrying electronic components, the carrier tape comprising:

a longitudinally extending elevated central portion having a plurality of pockets formed therein and two side portions, each of the side portions is disposed on opposite sides of the elevated central portion and extending longitudinally therewith, wherein each of the two side portions is attached to the elevated central portion by an inclined portion such that the elevated central portion is higher than the two side portions when disposed in a flat configuration, and wherein each of the two side portions includes an adhesion zone that is spaced apart from the elevated central portion.

Item 2 is the carrier tape of item 1, further comprising at least one row of advancement structures formed longitudinally along the side portion of the carrier tape.

Item 3 is the carrier tape of item 1, further comprising at a row of aligned advancement structures formed longitudinally along each side portion of the carrier tape.

Item 4 is the carrier tape of item 1, wherein each of the plurality of pockets includes at least one side walls that extends down from a top surface of the elevated central portion and is joined to a bottom wall and wherein the bottom wall of each of the pockets defines a reference plane.

Item 5 is the carrier tape of item 4, wherein the side portions are generally parallel with the bottom wall of each of the pockets.

Item 6 is the carrier tape of item 4, wherein the elevated central portion is generally parallel with the bottom wall of each of the pockets.

Item 7 is the carrier tape of item 4, wherein the side portions are disposed at a first reference height relative to the reference plane and the elevated central portion is disposed at a second reference height relative to the reference plane and wherein the second reference height is greater than the first reference height.

Item 8 is the carrier tape of item 1, wherein the elevated central portion comprises a plurality of plateau portions disposed between adjacent pockets within the elevated central portion and having a plateau surface and a pair of rail portions that extend longitudinally along the elevated central portion on either side of the pockets and having a rail surface.

Item 9 is the carrier tape of item 8, wherein the plateau surface and the rail surface are coplanar.

Item 10 is the carrier tape of item 8, wherein the plateau surface is higher than the rail surface.

Item 11 is a carrier tape having pockets for carrying electronic components, the carrier tape comprising:

a longitudinally extending central portion having a plurality of pockets formed therein and a plurality of elevated lip portions wherein the elevated lip portions are adjacent to at least a portion of each edge of each of the pockets are formed within the central portion and two side portions, each of the side portions is disposed on opposite sides of the central portion and extend longitudinally therewith, wherein each of the side portions includes an adhesion zone that is spaced apart from the central portion, the adhesion zone being adapted to adhere to a cover film.

Item 12 is the carrier tape of item 11, wherein the elevated lip portions are discontinuous.

Item 13 is the carrier tape of item 11, wherein the elevated lip portions are continuous and completely surrounds the pockets disposed within the central portion of the carrier tape.

Item 14 is the carrier tape of item 11, wherein the pocket includes at least one side walls that extends down from a top surface of at least one of the elevated lip portions and is adjoined a bottom wall and wherein the bottom wall of the pocket defines a reference plane.

Item 15 is the carrier tape of item 14, wherein the side portions are disposed at a first reference height relative to the reference plane and the top surface of at least one of the elevated lip portions is disposed at a second reference height relative to the reference plane and wherein the second reference height is greater than the first reference height.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A carrier tape having pockets for carrying electronic components, the carrier tape comprising:
    a longitudinally extending elevated central portion having a plurality of pockets formed therein and two side portions, each of the side portions is disposed on opposite sides of the elevated central portion and extending longitudinally therewith, wherein each of the two side portions is attached to the elevated central portion such that the elevated central portion is higher than the two side portions when disposed in a flat configuration, and wherein each of the plurality of pockets includes at least one side wall that extends down from a top surface of the elevated central portion and is joined to a bottom wall.

2. The carrier tape of claim 1, wherein the side portions are generally parallel with the bottom wall of each of the pockets.

3. The carrier tape of claim 1, wherein the elevated central portion is generally parallel with the bottom wall of each of the pockets.

4. The carrier tape of claim 1, wherein the side portions are disposed at a first reference height relative to the reference plane and the elevated central portion is disposed at a second reference height relative to the reference plane and wherein the second reference height is greater than the first reference height.

5. A carrier tape having pockets for carrying electronic components, the carrier tape comprising:
    a longitudinally extending elevated central portion having a plurality of pockets formed therein and two side portions, each of the side portions is disposed on opposite sides of the elevated central portion and extending longitudinally therewith, wherein each of the two side portions is attached to the elevated central portion such that the elevated central portion is higher than the two side portions when disposed in a flat configuration, wherein the elevated central portion comprises a plurality of plateau portions disposed between adjacent pockets within the elevated central portion and having a plateau surface and a pair of rail portions that extend longitudinally along the elevated central portion on either side of the pockets and having a rail surface.

6. The carrier tape of claim 5, wherein the plateau surface and the rail surface are coplanar.

7. The carrier tape of claim 5, wherein the plateau surface is higher than the rail surface.

* * * * *